United States Patent
Hsieh

(10) Patent No.: US 12,203,975 B2
(45) Date of Patent: Jan. 21, 2025

(54) TESTING BOARD HAVING RF CONNECTOR SETS

(71) Applicant: BIZLINK INTERNATIONAL CORP., New Taipei (TW)

(72) Inventor: Chin-An Hsieh, New Taipei (TW)

(73) Assignee: BIZLINK INTERNATIONAL CORP., New Taipei (TW)

(*) Notice: Subject to any disclaimer, the term of this patent is extended or adjusted under 35 U.S.C. 154(b) by 80 days.

(21) Appl. No.: 18/055,417

(22) Filed: Nov. 15, 2022

(65) Prior Publication Data
US 2023/0152366 A1    May 18, 2023

(30) Foreign Application Priority Data
Nov. 15, 2021   (TW) .................................. 110142450

(51) Int. Cl.
*G01R 31/28*       (2006.01)

(52) U.S. Cl.
CPC ..... *G01R 31/2822* (2013.01); *G01R 31/2844* (2013.01)

(58) Field of Classification Search
CPC ............... G01R 1/0408; G01R 1/0416; G01R 31/2822; G01R 31/2844; G01R 1/06772; G01R 1/0466; G01R 1/0483; G01R 1/06716; G01R 1/06733; G01R 11/04; H01R 35/04; H01R 24/50; H01R 9/0521; H01R 24/58; H01R 12/724; H01R 13/639; H01R 9/05; H01R 24/44; H01R 9/0512; H01R 12/52; H01R 12/57; H01R 12/598; H01R 13/658; H01R 13/6581; H01R 12/716; H01R 12/73; H01R 13/65918; H05K 7/06; H05K 2201/10318; H05K 2201/10325; H05K 2201/09809; H05K 2201/10303; H05K 1/0219; H05K 7/1092

See application file for complete search history.

(56) References Cited

U.S. PATENT DOCUMENTS

| | | | | |
|---|---|---|---|---|
| 6,561,815 B1 * | 5/2003 | Schmidt | ............. | H01R 13/6205 439/38 |
| 7,126,155 B1 * | 10/2006 | Kanal | ................ | G01R 31/2818 257/797 |
| 7,464,999 B2 * | 12/2008 | Quinn | .................... | A47B 43/00 312/258 |
| 7,821,250 B2 * | 10/2010 | Turner | ................. | G01R 1/0408 324/95 |
| 9,620,908 B2 * | 4/2017 | Zieman | ................ | H01R 13/659 |

(Continued)

FOREIGN PATENT DOCUMENTS

| TW | I637181 B | 10/2018 |
|---|---|---|
| TW | 202109059 A | 3/2021 |

*Primary Examiner* — Vinh P Nguyen
(74) *Attorney, Agent, or Firm* — CKC & Partners Co., LLC

(57) ABSTRACT

A testing board (i.e., testing fixture) includes a printed circuit board (PCB), an external connection port, and plural coaxial radio frequency (RF) connector sets. The external connection port is located on the printed circuit board. Each of the coaxial RF connector sets includes a top coaxial RF connector and a bottom coaxial RF connector. The top coaxial RF connector and the bottom coaxial RF connector are respectively disposed on a top surface and a bottom surface of the printed circuit board in a coaxial arrangement and electrically connect to the external connection port.

13 Claims, 4 Drawing Sheets

(56) References Cited

U.S. PATENT DOCUMENTS

| | | | | |
|---|---|---|---|---|
| 10,454,223 B2* | 10/2019 | Bayar | ................ | H01R 13/6598 |
| 10,725,092 B1* | 7/2020 | Tsironis | ................ | G01R 1/0408 |
| 11,903,124 B2* | 2/2024 | Shaw | ................... | H05K 1/0222 |

* cited by examiner

000# TESTING BOARD HAVING RF CONNECTOR SETS

RELATED APPLICATIONS

This application claims priority to Taiwan Application Serial Number 110142450, filed Nov. 15, 2021, which is herein incorporated by reference.

BACKGROUND

Field of Invention

The present disclosure relates to a testing board. More particularly, the present disclosure relates to a testing board including plural radio frequency (RF) connectors (i.e., testing fixture).

Description of Related Art

Generally speaking, a structural top view of a conventional testing board having coaxial radio frequency (RF) connectors is shown in FIG. 1. The printed circuit board 210 of the conventional testing board 200 is provided with a connection port 220 and plural coaxial RF connectors 230. The coaxial RF connectors 230 are disposed on the top and bottom surfaces of the printed circuit board 210, and the positions of the coaxial RF connectors 230 on the same surface relative to the connection port 220 are substantially arranged along the circumference of the radius R. In addition, the coaxial RF connectors 230 respectively on the top and bottom surfaces of the printed circuit board 210 are staggered and not overlapped with each other. For example, the position of the coaxial RF connector (not shown) on the bottom surface of the printed circuit board 210 corresponds to the position of one end of the conductive line shown in FIG. 1. As can be seen from the figure, the top and bottom surfaces of the printed circuit board 210 respectively include six coaxial RF connectors 230 and four coaxial RF connectors 230, a total of ten. In use, the product can be connected to the port 220 and a measuring device can be connected to the coaxial RF connectors 230 to perform signal integrity testing.

In order to increase the density of the coaxial RF connectors 230 on the printed circuit board 210, screws can be disposed on positions covered by the sockets of the coaxial RF connectors 230 in a traditional method to reduce the size of a base, so that the printed circuit board 210 can be provided with more coaxial RF connectors 230. However, the effect of the above method is limited, and the wiring from the coaxial RF connector 230 to the connection port 220 is long, which results in a large signal loss and making it difficult to improve measurement accuracy.

SUMMARY

In view of this, one object of the present disclosure is to provide a testing board that can solve the above problems.

In order to achieve the aforementioned purpose, according to some embodiments of the present disclosure, a testing board includes a printed circuit board (PCB), an external connection port, and plural coaxial radio frequency (RF) connector sets. The external connection port is located on the printed circuit board. Each of the coaxial RF connector sets includes a top coaxial RF connector and a bottom coaxial RF connector. The top coaxial RF connector and the bottom coaxial RF connector are respectively disposed on a top surface and a bottom surface of the printed circuit board in a coaxial arrangement and electrically connect to the external connection port.

In some embodiments, the testing board further includes a first connecting element, wherein each of the top coaxial RF connector and the bottom coaxial RF connector has a socket, and a shortest linear distance between the socket and the first connecting element and along an extending direction of the printed circuit board is greater than zero.

In some embodiments, the testing board further includes a second connecting element, wherein the top coaxial RF connector and the bottom coaxial RF connector are respectively fixed on the top surface and the bottom surface of the printed circuit board by both of the first connecting element and the second connecting element simultaneously.

In some embodiments, each of the top coaxial RF connector and the bottom coaxial RF connector has a non-threaded through-hole and a threaded hole, the first connecting element passes through the non-threaded through-hole of the top coaxial RF connector to fix in the threaded hole of the bottom coaxial RF connector, and the second connecting element passes through the non-threaded through-hole of the bottom coaxial RF connector to fix in the threaded hole of the top coaxial RF connector.

In some embodiments, one of the top coaxial RF connector and the bottom coaxial RF connector has a first non-threaded through-hole and a second non-threaded through-hole, the other has a first threaded hole and a second threaded hole, the first connecting element passes through the first non-threaded through-hole to fix in the first threaded hole, and the second connecting element passes through the second non-threaded through-hole to fix in the second threaded hole.

In some embodiments, a difference between a buried distance that is between the external connection port and the top coaxial RF connector and a buried distance that is between the external connection port and the bottom coaxial RF connector is not more than 1%.

In some embodiments, a shortest linear distance between at least one of the top coaxial RF connectors and the external connection port is greater than all of the shortest linear distance of the reminding top coaxial RF connectors.

In some embodiments, the top coaxial RF connectors on the printed circuit board are arranged in a fan shape, and a position of the top coaxial RF connector furthest from the external connection port is not more than half a width of the printed circuit board.

In some embodiments, a farthest distance between two sides of a base of the top coaxial RF connector is V, a distance between a central axis of one of the top coaxial RF connectors on the printed circuit board that is farthest from the external connection port and the external connection port is K, and K is smaller than 3V.

In some embodiments, a farthest distance between two sides of a base of the top coaxial RF connector is V, a distance between a central axis of one of the top coaxial RF connectors on the printed circuit board that is closest to the external connection port and the external connection port is K, and K is smaller than 2.5V.

According to some embodiments of the present disclosure, a testing board includes a printed circuit board (PCB), an external connection port, and plural coaxial radio frequency (RF) connector sets. The external connection port is located on the printed circuit board. Each of the coaxial RF connector sets includes a top coaxial RF connector and a bottom coaxial RF connector. The top coaxial RF connector and the bottom coaxial RF connector are respectively disposed on a top surface and a bottom surface of the printed circuit board, and are aligned with each other in a direction perpendicular to the printed circuit board, and electrically connect to the external connection port.

In some embodiments, the testing board further includes a first connecting element, wherein each of the top coaxial RF connector and the bottom coaxial RF connector has a socket, and a shortest linear distance between the socket and the first connecting element and along an extending direction of the printed circuit board is greater than zero.

In some embodiments, the testing board further includes a second connecting element, wherein the top coaxial RF connector and the bottom coaxial RF connector are respectively fixed on the top surface and the bottom surface of the printed circuit board by using the first connecting element and the second connecting element.

In some embodiments, each of the top coaxial RF connector and the bottom coaxial RF connector has a non-threaded through-hole and a threaded hole, the first connecting element passes through the non-threaded through-hole of the top coaxial RF connector to fix in the threaded hole of the bottom coaxial RF connector, and the second connecting element passes through the non-threaded through-hole of the bottom coaxial RF connector to fix in the threaded hole of the top coaxial RF connector.

In some embodiments, one of the top coaxial RF connector and the bottom coaxial RF connector has a first non-threaded through-hole and a second non-threaded through-hole, the other has a first threaded hole and a second threaded hole, the first connecting element passes through the first non-threaded through-hole to fix in the first threaded hole, and the second connecting element passes through the second non-threaded through-hole to fix in the second threaded hole.

In summary, in the above-mentioned embodiments of the present disclosure, since each of the coaxial RF connector sets has the top coaxial RF connector and the bottom coaxial RF connector that are respectively disposed on the top surface and the bottom surface of the printed circuit board in a coaxial arrangement, the top coaxial RF connector and the bottom coaxial RF connector of a single coaxial RF connector set are aligned with each other in a direction perpendicular to the printed circuit board. As a result, compared with a traditional testing board, the testing board of the present disclosure can be provided with more top coaxial RF connectors and more bottom coaxial RF connectors. Moreover, the density of the top coaxial RF connectors and the density of the bottom coaxial RF connectors can be increased to shorten the wiring length of the testing board (e.g., buried lines between the external connection port and the coaxial connector set), thereby decreasing signal loss and effectively improving measurement accuracy.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
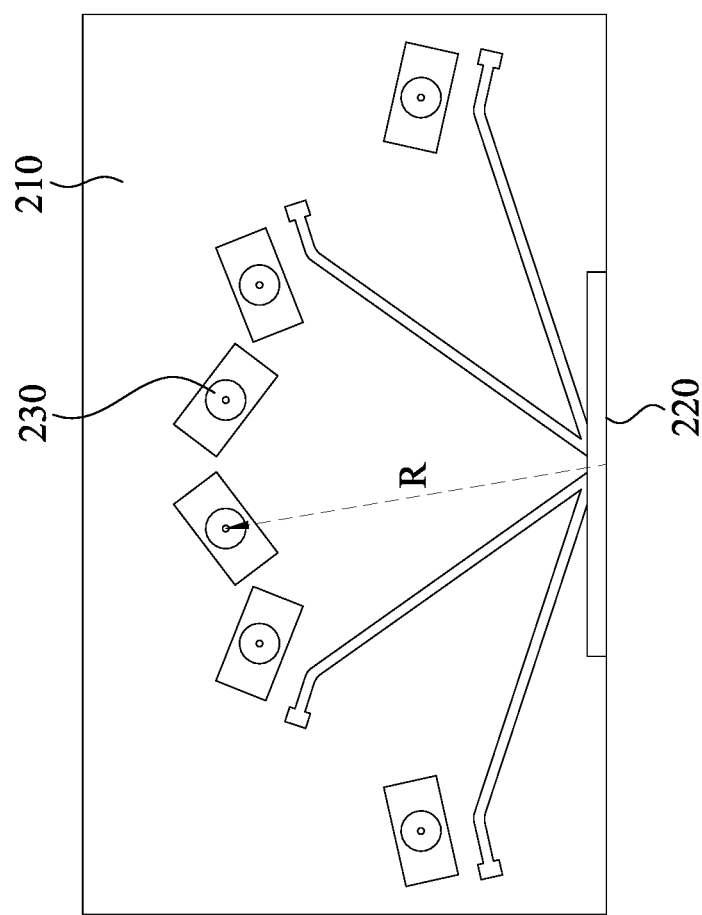
FIG. 1 is a top view of a conventional testing board.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "bottom," "above," "upper", "top" and the like, may be used herein for ease of description to describe one component or feature's relationship to another component(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Figure 2:
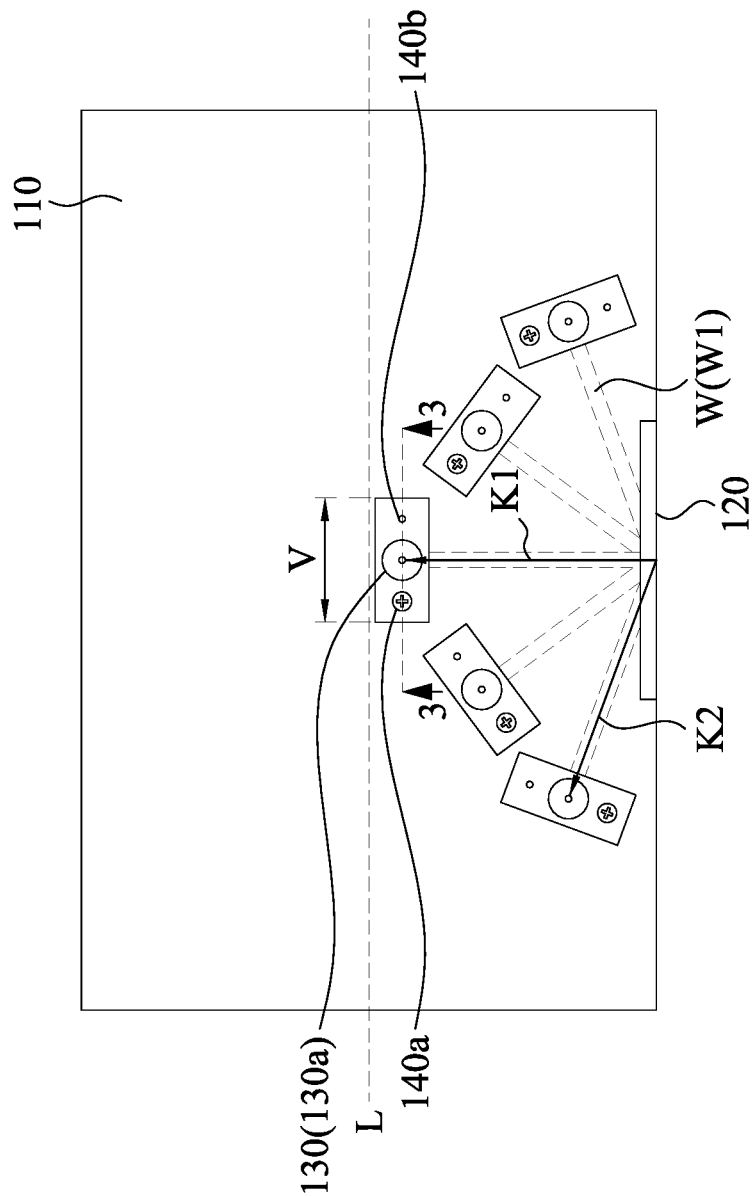
FIG. 2 is a top view of a testing board according to one embodiment of the present disclosure.
Figure 3:
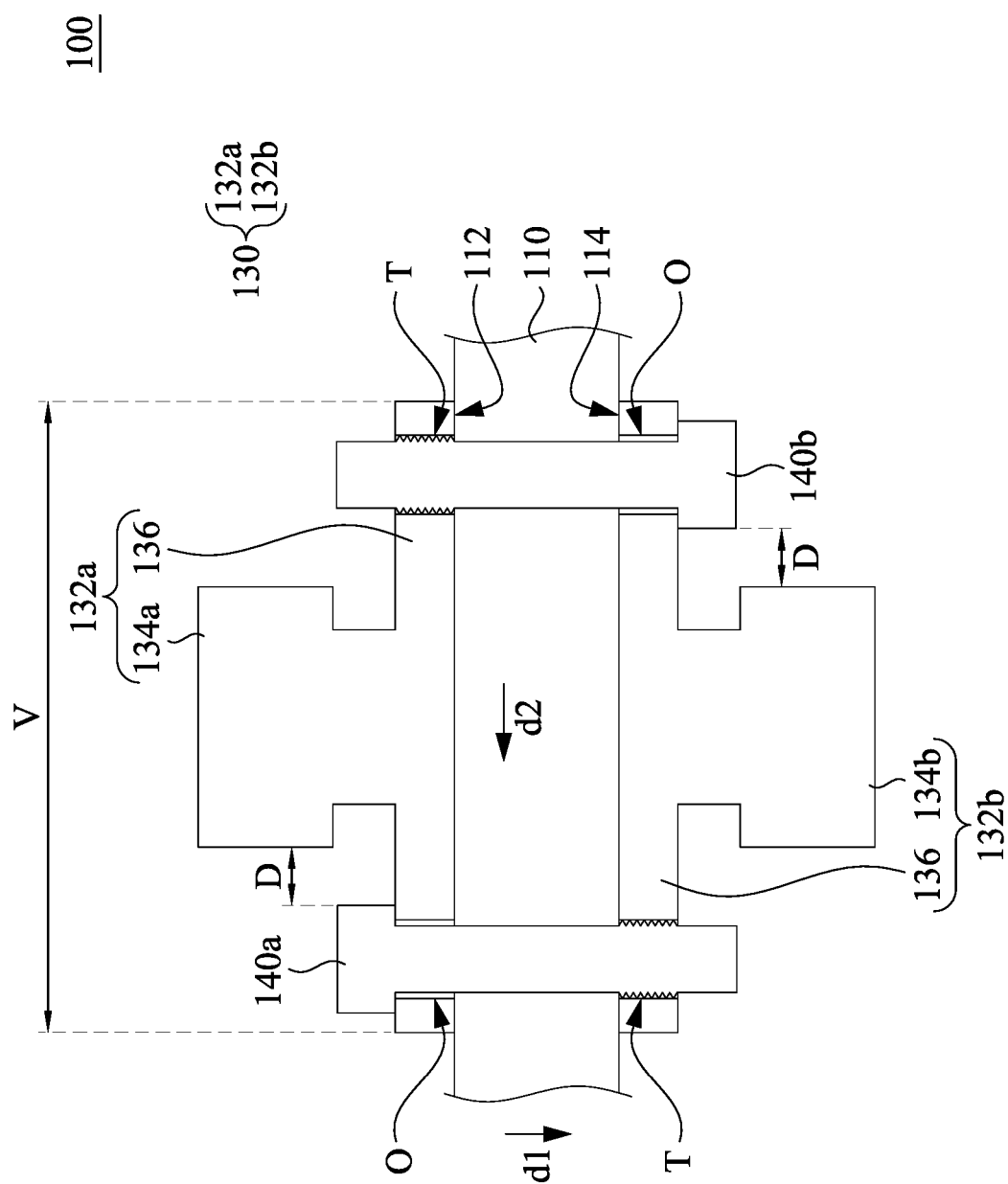
FIG. 3 is a cross-sectional view of the testing board taken along line 3-3 of FIG. 2.

FIG. 2 is a top view of a testing board 100 according to one embodiment of the present disclosure. FIG. 3 is a cross-sectional view of the testing board 100 taken along line 3-3 of FIG. 2. As shown in FIG. 2 and FIG. 3, the testing board 100 includes a printed circuit board (PCB) 110, an external connection port 120, and plural coaxial radio frequency (RF) connector sets 130. As shown in FIG. 2, the external connection port 120 (e.g., a USB 3.0 female socket or a board-side TYPE C connector) may be fixed on an side edge of the printed circuit board 110, and the socket of the external connection port 120 is directed to the bottom of FIG. 2 for being inserted by a corresponding male socket. However, the present disclosure is not limited in this regard, when necessary, the external connection port 120 can be fixed on the central portion of the printed circuit board 110 and its socket may be directed to the normal vector direction of the working surface of the circuit board 110, and the coaxial RF connector sets 130 uses the external connection port 120 as the center to radiate outward to form a round shape and are respectively disposed on the front and back surfaces of all side edges of the printed circuit board 110. Further, in this embodiment, the outline of the printed circuit board 110 may be a perfect circle or other regular polygon shapes.

In this embodiment, five coaxial RF connector sets 130 are included, but the number of the coaxial RF connector sets 130 is not limited to five. As shown in FIG. 3, each of the coaxial RF connector sets 130 includes a top coaxial RF connector 132a and a bottom coaxial RF connector 132b. The top coaxial RF connector 132a and the bottom coaxial RF connector 132b are respectively disposed on a top surface 112 and a bottom surface 114 of the printed circuit board 110 in a coaxial arrangement. In the following description, "coaxial arrangement" is referred to as the top coaxial RF connector 132a and the bottom coaxial RF connector 132b of one coaxial RF connector set that are aligned with each other in a direction d1 perpendicular to the printed circuit board 110. In other words, the top coaxial RF connector 132a and the bottom coaxial RF connector 132b are symmetrically disposed on the top surface 112 and the bottom surface 114 of the printed circuit board 110. In FIG. 2, the position of the bottom coaxial RF connector 132b (not shown) substantially overlaps the position of the top coaxial RF connector 132a, as shown in FIG. 3.

In some embodiments, the testing board 100 may be a signal integrated (SI) testing fixture. For example, the top coaxial RF connector 132a and the bottom coaxial RF connector 132b may be SubMiniature version A (SMA) testing socket connectors (testing sockets), which may be suitable for transmitting high-frequency signals. The high-frequency signals are referred to as signals above 300 kHz, for example. Taking the SMA as an example, the SMA is suitable for measuring signals with GHz frequency. The aforementioned coaxial RF connectors are not limited to SMA specification. As long as a connector is coaxial and can support RF signals, it belongs to the category. For example, common specifications/types in the industry include PC 1.85, PC 3.5, SK, etc. In addition, the external connection port 120 may be electrically connected to the top coaxial RF connector 132a and the bottom coaxial RF connector 132b of the coaxial RF connector set 130 respectively through buried lines W and W1. In other embodiments, the buried lines W and W1 in the printed circuit board 110 may be replaced with exposed lines respectively on the top surface 112 and the bottom surface 114, depending on the design requirements. When the testing board 100 is in use, a product is connected to the external connection port 120, and a measurement device is connected to a number of the top coaxial RF connectors 132a and a number of the bottom coaxial RF connector 132b, so as to perform a signal integrated test.

Specifically, since each of the coaxial RF connector sets 130 of the testing board 100 has the top coaxial RF connector 132a and the bottom coaxial RF connector 132b that are respectively disposed on the top surface 112 and the bottom surface 114 of the printed circuit board 110 in a coaxial arrangement, the top coaxial RF connector 132a and the bottom coaxial RF connector 132b of a single coaxial RF connector set 130 are aligned with each other in the vertical direction d1. As a result, compared with the conventional testing board 200 of FIG. 1, the testing board 100 of FIG. 2 can be provided with more top coaxial RF connectors 132a and more bottom coaxial RF connectors 132b. Moreover, on the printed circuit board 110, the density of the top coaxial RF connectors 132a and the density of the bottom coaxial RF connectors 132b can be increased to shorten the wiring length of the testing board 100 (e.g., the buried lines W and W1 between the external connection port 120 and the coaxial RF connector set 130), thereby decreasing signal loss and effectively improving measurement accuracy.

In this embodiment, the testing board 100 further includes a first connecting element 140a. Each of the top coaxial RF connector 132a and the bottom coaxial RF connector 132b has a socket 134a. The shortest linear distance D between the socket 134a and the first connecting element 140a and along an extending direction d2 of the printed circuit board 110 is greater than zero. In other words, the first connecting element 140a does not overlap the socket 134a in the vertical direction d1. Such a configuration can prevent the first connecting element 140a from being in contact with the socket 134a to result in interference during fixing the first connecting element 140a.

The testing board 100 further includes a second connecting element 140b. The shortest linear distance D between the socket 134b and the second connecting element 140b and along the extending direction d2 of the printed circuit board 110 is also greater than zero. The top coaxial RF connector 132a and the bottom coaxial RF connector 132b are respectively fixed on the top surface 112 and the bottom surface 114 of the printed circuit board 110 by using the first connecting element 140a and the second connecting element 140b (i.e., by both of the first connecting element 140a and the second connecting element 140b simultaneously). That is to say, merely using the first connecting element 140a and the second connecting element 140b can fix the top coaxial RF connector 132a and the bottom coaxial RF connector 132b at a corresponding position, thereby reducing assembly time and the material cost of connecting elements.

In this embodiment, the first connecting element 140a and the second connecting element 140b may be screws. Each of the top coaxial RF connector 132a and the bottom coaxial RF connector 132b has a non-threaded through-hole O and a threaded hole T. The non-threaded through-hole O of the top coaxial RF connector 132a is substantially aligned with the threaded hole T of the bottom coaxial RF connector 132b. The threaded hole T of the top coaxial RF connector 132a is substantially aligned with the non-threaded through-hole O of the bottom coaxial RF connector 132b. The first connecting element 140a can pass through the non-threaded through-hole O of the top coaxial RF connector 132a to fix in the threaded hole T of the bottom coaxial RF connector 132b, and the second connecting element 140b can pass through the non-threaded through-hole O of the bottom coaxial RF connector 132b to fix in the threaded hole T of the top coaxial RF connector 132a.

Moreover, a difference between a distance of the buried line W (i.e., a buried distance) that is between the external connection port 120 and the top coaxial RF connector 132a and a distance of the buried line W1 that is between the external connection port 120 and the bottom coaxial RF connector 132b is not more than 1%. In other words, the two distances may be regarded as substantially the same. When designing, the buried line W and the buried line W1 can overlap to a certain extent but they are disposed in an insulating manner by insulating layers in the printed circuit board 110.

In this embodiment, the linear distance K1 between at least one of the top coaxial RF connectors 132a (e.g., the top coaxial RF connector 132a adjacent to the center of FIG. 2) and the external connection port 120 is greater than the linear distance K2 between each of the other top coaxial RF connectors 132a (e.g., the outer top coaxial RF connector 132a of FIG. 2) and the external connection port 120. When needed, the plural top coaxial RF connectors 132a may be located at the positions of the linear distance K1, or the differences of the linear distances K1 of the top coaxial RF connectors 132a are in a range of ±1%. The measurement of the linear distance between the external connection port 120 and each of the coaxial RF connectors is the shortest linear distance measured from the center of the central axis of each of the coaxial RF connectors to the corresponding socket of the external connection port 120. As shown in FIG. 2, except for the distance of the top coaxial RF connector 132a at the center of FIG. 2 is K1, the linear distances K2 of the other top coaxial RF connectors 132a are the same or falls within the range of ±1% of the linear distance K2.

In addition, the top coaxial RF connectors 132a on the printed circuit board 110 are arranged in a fan shape. If the side on which the external connection port 120 is disposed is regarded as the font side of the printed circuit board 110, the position of the top coaxial RF connector 132a furthest from the external connection port 120 is not more than half the width of the printed circuit board 110 along a front-to-rear direction. Explain in detail, the dotted line L of FIG. 2 presents along half the width of the printed circuit board 110, and the positions of all of the top coaxial RF connectors 132a are located below the dotted line L (i.e., on the bottom portion of the printed circuit board 110). Even if the top coaxial RF connector 132a adjacent to the center is not beyond the dotted line L. Compared with the conventional testing board 200 of FIG. 1, the present configuration can greatly reduce the wiring length of the testing board 100 (e.g., the buried lines W and W1), thereby effectively improving measurement accuracy.

In this embodiment, the farthest distance V is between the two sides of a base 136 of the top coaxial RF connector 132a, and the farthest distance is referred to as the longest straight-line distance between any two points of the base 136 on the tangent plane parallel to the printed circuit board 110. A distance K1 is between the central axis of one of the top coaxial RF connectors 132a on the printed circuit board 110 that is farthest from the external connection port 120 (e.g., the top coaxial RF connector 132a adjacent to the center of FIG. 2) and the external connection port 120, and K1 is smaller than 3V. Further, a distance K2 is between the central axis of one of the top coaxial RF connectors 132a on the printed circuit board 110 that is closest to the external connection port 120 and the external connection port 120, and K2 is smaller than 2.5V. Through the aforementioned design, all of the top coaxial RF connectors 132a will not be beyond half the region of the printed circuit board 110, thereby effectively improving measurement accuracy. In addition, the arrangement of the bottom coaxial RF connectors 132 may be the same as the aforesaid arrangement, and will not be repeated again. The aforementioned distance relationship is related to the number of the coaxial RF connectors on the printed circuit board 110. When comparing, the printed circuit board 110 may selectively include ten coaxial RF connectors as a condition.

It is to be noted that the connection relationships, the materials, and the advantages of the elements described above will not be repeated in the following description. In the following description, other types of testing boards will be explained.

Figure 4:
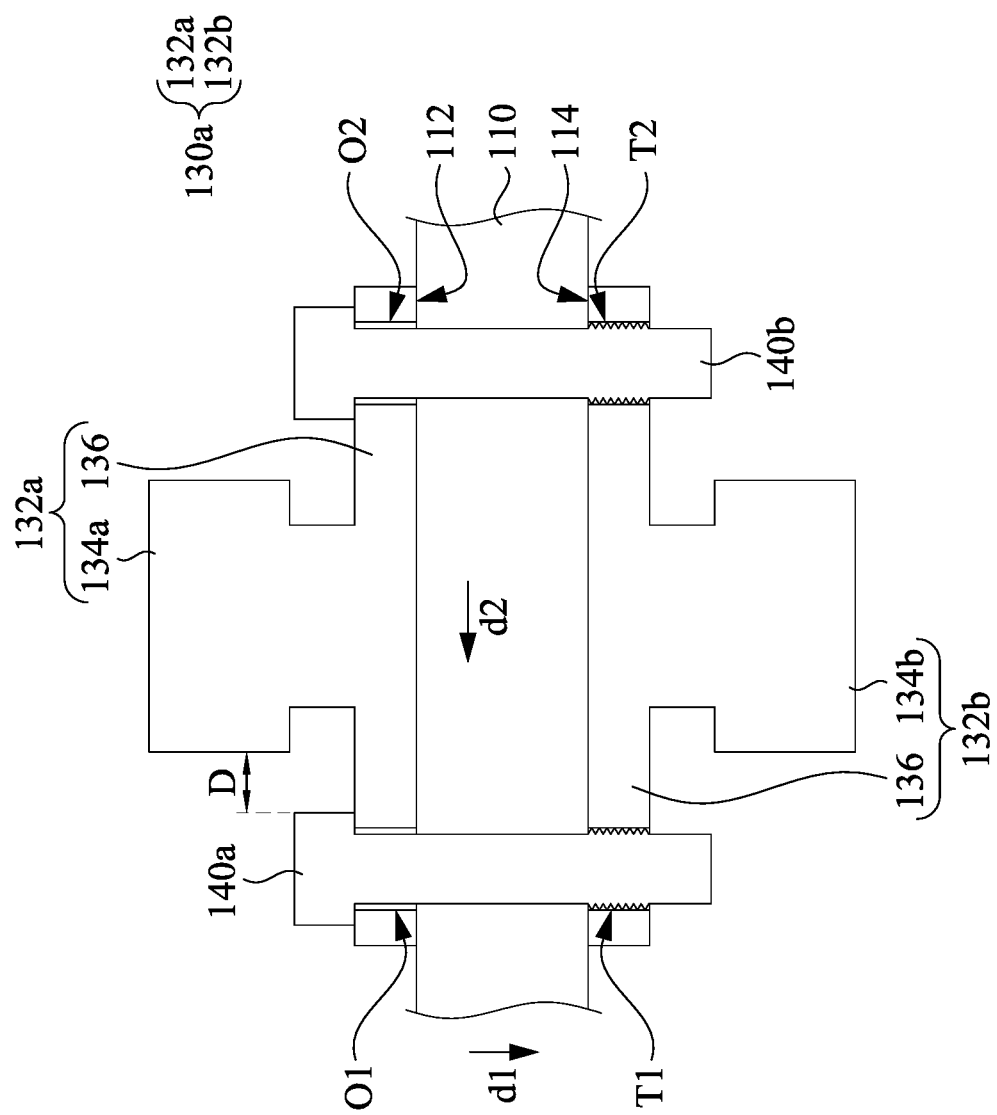
FIG. 4 is a cross-sectional view of a testing board according to another embodiment of the present disclosure.

FIG. 4 is a cross-sectional view of a testing board 100a according to another embodiment of the present disclosure. The testing board 100a includes the printed circuit board 110, the external connection port 120, and plural RF connector sets 130a. The difference between this embodiment and the embodiment of FIG. 3 is that the top coaxial RF connector 132a of the connector set 130a has a first non-threaded through-hole O1 and a second non-threaded through-hole O2, and the bottom coaxial RF connector 132b has a first threaded hole T1 and a second threaded hole T2. The non-threaded through-hole O of the top coaxial RF connector 132a is substantially aligned with the threaded hole T of the bottom coaxial RF connector 132b. Moreover, the first connecting element 140a passes through the first non-threaded through-hole O1 of the top coaxial RF connector 132a to fix in the first threaded hole T1 of the bottom coaxial RF connector 132b. The second connecting element 140b passes through the second non-threaded through-hole O2 of the top coaxial RF connector 132a to fix in the second threaded hole T2 of the bottom coaxial RF connector 132b.

In alternative embodiment, the first non-threaded through-hole O1 and the second non-threaded through-hole O2 of the top coaxial RF connector 132a of the connector set 130a may be replaced with threaded holes, while the first threaded hole T1 and the second threaded hole T2 of the bottom coaxial RF connector 132b may be replaced with through-holes. It is only necessary to flip the first connecting element 140a and the second connecting element 140b of FIG. 4 180 degrees to fix, depending on the design requirements.

The foregoing has described features of several embodiments to allow those skilled in the art to better understand aspects of the present disclosure. Those skilled in the art should appreciate that they may readily use the present disclosure as a basis for designing or modifying other processes and structures to achieve the same objectives and/or achieve the same advantages of the embodiments described herein. Those skilled in the art should also understand that such equivalent structures do not depart from the spirit and scope of the present disclosure, and various changes, substitutions and alterations can be made herein without departing from the spirit and scope of the present disclosure.

What is claimed is:

1. A testing board comprising:
   a printed circuit board;
   an external connection port disposed on the printed circuit board;
   a plurality of coaxial radio frequency (RF) connector sets, wherein each of the
   RF connector sets includes a top coaxial RF connector and a bottom coaxial RF connector, and the top coaxial RF connector and the bottom coaxial RF connector are respectively disposed on a top surface and a bottom surface of the printed circuit board in a coaxial arrangement, and are electrically connect to the external connection port; and
   a first connecting element, wherein each of the top coaxial RF connector and the bottom coaxial RF connector has a socket, and a shortest linear distance between the socket and the first connecting element along an extending direction of the printed circuit board is greater than zero.

2. The testing board of claim 1, further comprising a second connecting element, wherein the top coaxial RF connector and the bottom coaxial RF connector are respectively fixed on the top surface and the bottom surface of the printed circuit board by both of the first connecting element and the second connecting element simultaneously.

3. The testing board of claim 2, wherein each of the top coaxial RF connector and the bottom coaxial RF connector has a non-threaded through-hole and a threaded hole, the first connecting element passes through the non-threaded through-hole of the top coaxial RF connector to fix in the threaded hole of the bottom coaxial RF connector, and the second connecting element passes through the non-threaded through-hole of the bottom coaxial RF connector to fix in the threaded hole of the top coaxial RF connector.

4. The testing board of claim 2, wherein one of the top coaxial RF connector and the bottom coaxial RF connector has a first non-threaded through-hole and a second non-threaded through-hole, the other has a first threaded hole and a second threaded hole, the first connecting element passes through the first non-threaded through-hole to fix in the first threaded hole, and the second connecting element passes through the second non-threaded through-hole to fix in the second threaded hole.

5. The testing board of claim 1, wherein a difference between a buried distance between the external connection port and the top coaxial RF connector and a buried distance between the external connection port and the bottom coaxial RF connector is not more than 1%.

6. The testing board of claim 1, wherein the top coaxial RF connectors on the printed circuit board are arranged in a fan shape, and a position of the top coaxial RF connector furthest from the external connection port is not more than half a width of the printed circuit board.

7. The testing board of claim 1, wherein a farthest distance between two sides of a base of the top coaxial RF connector is V, a distance between a central axis of one of the top coaxial RF connectors on the printed circuit board that is farthest from the external connection port, and the external connection port is K, and K is smaller than 3V.

8. The testing board of claim 1, wherein a farthest distance between two sides of a base of the top coaxial RF connector is V, a distance between a central axis of one of the top coaxial RF connectors on the printed circuit board that is closest to the external connection port and the external connection port is K, and K is smaller than 2.5V.

9. A testing board comprising:
a printed circuit board;
an external connection port disposed on the printed circuit board; and
a plurality of coaxial radio frequency (RF) connector sets, wherein each of the RF connector sets includes a top coaxial RF connector and a bottom coaxial RF connector, and the top coaxial RF connector and the bottom coaxial RF connector are respectively disposed on a top surface and a bottom surface of the printed circuit board, and are aligned with each other in a direction perpendicular to the printed circuit board, and electrically connect to the external connection port.

10. The testing board of claim 9, further comprising a first connecting element, wherein each of the top coaxial RF connector and the bottom coaxial RF connector has a socket, and a shortest linear distance between the socket and the first connecting element and along an extending direction of the printed circuit board is greater than zero.

11. The testing board of claim 10, further comprising a second connecting element, wherein the top coaxial RF connector and the bottom coaxial RF connector are respectively fixed on the top surface and the bottom surface of the printed circuit board by using the first connecting element and the second connecting element.

12. The testing board of claim 11, wherein each of the top coaxial RF connector and the bottom coaxial RF connector has a non-threaded through-hole and a threaded hole, the first connecting element passes through the non-threaded through-hole of the top coaxial RF connector to fix in the threaded hole of the bottom coaxial RF connector, and the second connecting element passes through the non-threaded through-hole of the bottom coaxial RF connector to fix in the threaded hole of the top coaxial RF connector.

13. The testing board of claim 11, wherein one of the top coaxial RF connector and the bottom coaxial RF connector has a first non-threaded through-hole and a second non-threaded through-hole, the other has a first threaded hole and a second threaded hole, the first connecting element passes through the first non-threaded through-hole to fix in the first threaded hole, and the second connecting element passes through the second non-threaded through-hole to fix in the second threaded hole.

* * * * *